(12) United States Patent
Ohta

(10) Patent No.: US 11,329,110 B2
(45) Date of Patent: May 10, 2022

(54) DISPLAY DEVICE HAVING ORGANIC BUFFER LAYER BETWEEN INORGANIC SEALING FILMS AND METHOD OF MANUFACTURING DISPLAY DEVICE

(71) Applicant: SHARP KABUSHIKI KAISHA, Sakai (JP)

(72) Inventor: Yoshifumi Ohta, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 52 days.

(21) Appl. No.: 16/957,271

(22) PCT Filed: Dec. 27, 2017

(86) PCT No.: PCT/JP2017/046951
§ 371 (c)(1),
(2) Date: Jun. 23, 2020

(87) PCT Pub. No.: WO2019/130480
PCT Pub. Date: Jul. 4, 2019

(65) Prior Publication Data
US 2021/0005841 A1    Jan. 7, 2021

(51) Int. Cl.
*H01L 27/32* (2006.01)
*H01L 51/56* (2006.01)
*H01L 51/00* (2006.01)
*H01L 51/52* (2006.01)

(52) U.S. Cl.
CPC ...... *H01L 27/3244* (2013.01); *H01L 51/0021* (2013.01); *H01L 51/5225* (2013.01); *H01L 51/5246* (2013.01); *H01L 51/5253* (2013.01); *H01L 51/56* (2013.01)

(58) Field of Classification Search
CPC ............. H01L 51/5253; H01L 27/3244; H01L 51/0021; H01L 51/5225; H01L 51/5246; H01L 51/525
See application file for complete search history.

(56) References Cited

U.S. PATENT DOCUMENTS

| | | | |
|---|---|---|---|
| 2007/0159089 A1* | 7/2007 | Oh | H01L 27/3246 313/506 |
| 2014/0117330 A1 | 5/2014 | Cho et al. | |
| 2017/0069873 A1* | 3/2017 | Kim | H01L 51/525 |
| 2017/0244063 A1* | 8/2017 | Furuie | H05K 999/99 |
| 2018/0123082 A1* | 5/2018 | Sasaki | H01L 51/5246 |

FOREIGN PATENT DOCUMENTS

JP    2014-086415 A    5/2014

* cited by examiner

*Primary Examiner* — Michael Jung
(74) *Attorney, Agent, or Firm* — ScienBiziP, P.C.

(57) ABSTRACT

A display device includes: a base substrate; light-emitting elements on the base substrate with a TFT layers intervening between the light-emitting elements and the base substrate, to form a display area; a sealing film including a sequentially formed stack of a first inorganic film and a second inorganic film and provided so as to cover the light-emitting elements; and an insular non-display area in the display area, wherein the non-display area includes a frame-shaped inner circular wall protruding in a thickness direction of the base substrate and extending along a boundary between the non-display area and the display area, and the inner circular wall includes on a surface thereof an organic buffer layer interposed between the first inorganic film and the second inorganic film.

19 Claims, 9 Drawing Sheets

(a)

(b)

(c)

(d)

DISPLAY DEVICE HAVING ORGANIC BUFFER LAYER BETWEEN INORGANIC SEALING FILMS AND METHOD OF MANUFACTURING DISPLAY DEVICE

TECHNICAL FIELD

The present invention relates to a display device and a method of manufacturing display device.

BACKGROUND ART

An organic EL (Electro Luminescence) display device, or a self-luminous display device built around an organic EL element has attracted attention as an alternative for liquid crystal display devices. A sealing structure in which a sealing film covering the organic EL element is provided by a stack of organic and inorganic layers is suggested for the organic EL display device to prevent degradation of the organic EL element due to contamination by, for example, water and oxygen.

For instance, Patent Literature 1 discloses a display device including: a layered structure in which inorganic film layers formed, for example, by CVD (chemical vapor deposition) and organic film layers formed, for example, by inkjet technology are alternately provided; and a thin film sealing layer covering organic light-emitting elements.

CITATION LIST

Patent Literature

Patent Literature 1: Japanese Unexamined Patent Application Publication, Tokukai, No. 2014-86415

SUMMARY OF INVENTION

Technical Problem

There is a demand in the organic EL display device to form an insular non-display area in the display area where an image is displayed, for example, in order to accommodate, for example, a camera or a fingerprint sensor in the insular non-display area. If the insular non-display area is provided in the display area of the organic EL display device, however, the sealing capability of the sealing film can deteriorate due to the non-display area.

In view of the foregoing problems, it is an object of the present invention to guarantee the sealing capability of the sealing film in a display device that includes the insular non-display area in the display area thereof.

Solution to Problem

To achieve the object, the display device in accordance with the present invention is directed to a display device including: a base substrate; light-emitting elements on the base substrate with a TFT layer intervening between the light-emitting elements and the base substrate, to form a display area; a sealing film including a sequentially formed stack of a first inorganic film and a second inorganic film and provided so as to cover the light-emitting elements; and an insular non-display area in the display area, wherein the non-display area includes a frame-shaped inner circular wall protruding in a thickness direction of the base substrate and extending along a boundary between the non-display area and the display area, and the inner circular wall includes on a surface thereof an organic buffer layer interposed between the first inorganic film and the second inorganic film.

Advantageous Effects of Invention

In the present invention, the non-display area includes a frame-shaped inner circular wall protruding in the thickness direction of the base substrate and extending along the boundary between the non-display area and the display area, and the inner circular wall includes on a surface thereof an organic buffer layer interposed between the first inorganic film and the second inorganic film. It is therefore possible to guarantee the sealing capability of the sealing film in a display device that includes an insular non-display area in the display area thereof.

DESCRIPTION OF EMBODIMENTS

The following will describe embodiments of the present invention in detail with reference to drawings. The scope of the present invention is not limited to these embodiments.

First Embodiment

Figure 1:
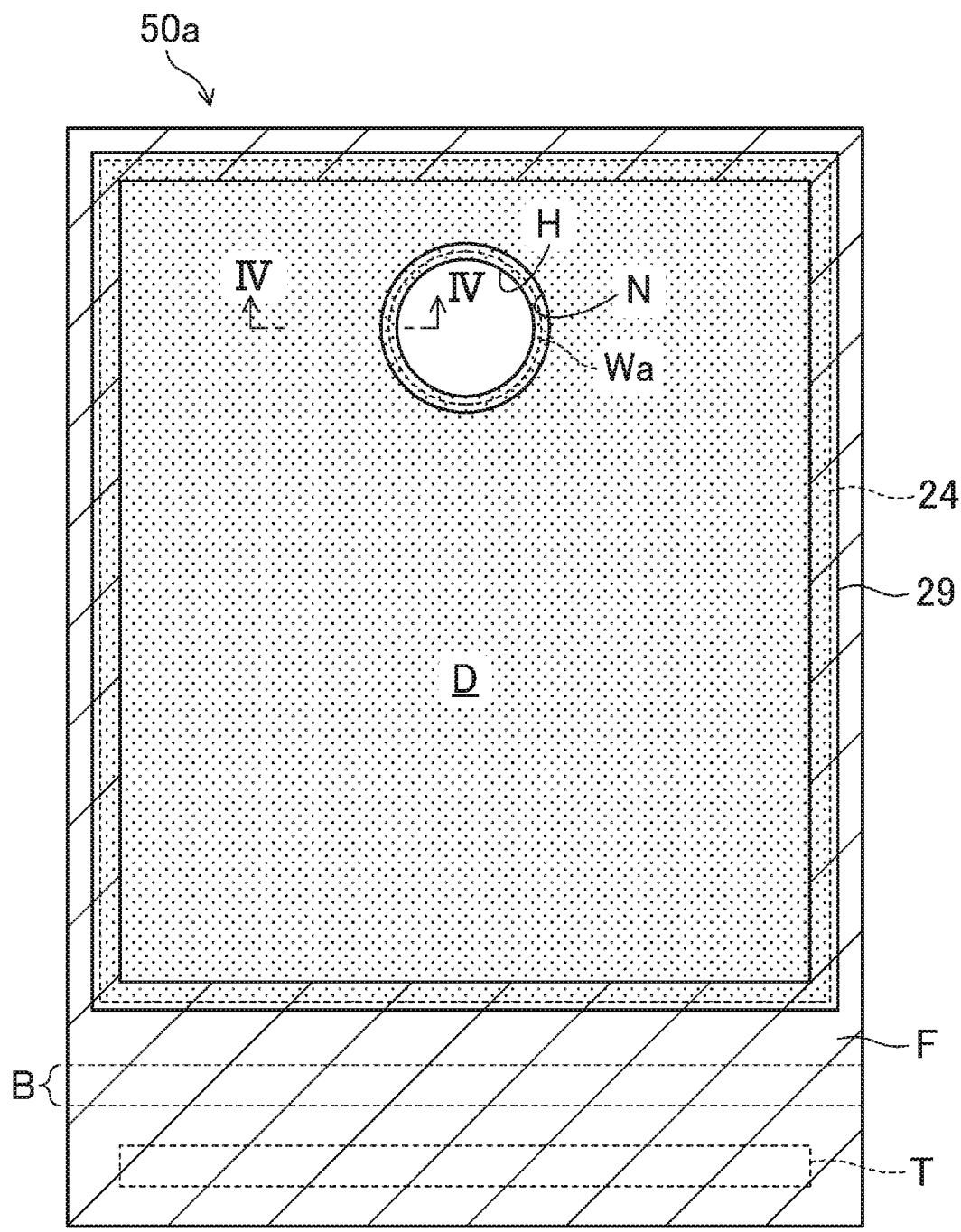
FIG. 1 is a schematic plan view of a structure of an organic EL display device in accordance with a first embodiment of the present invention.
Figure 2:
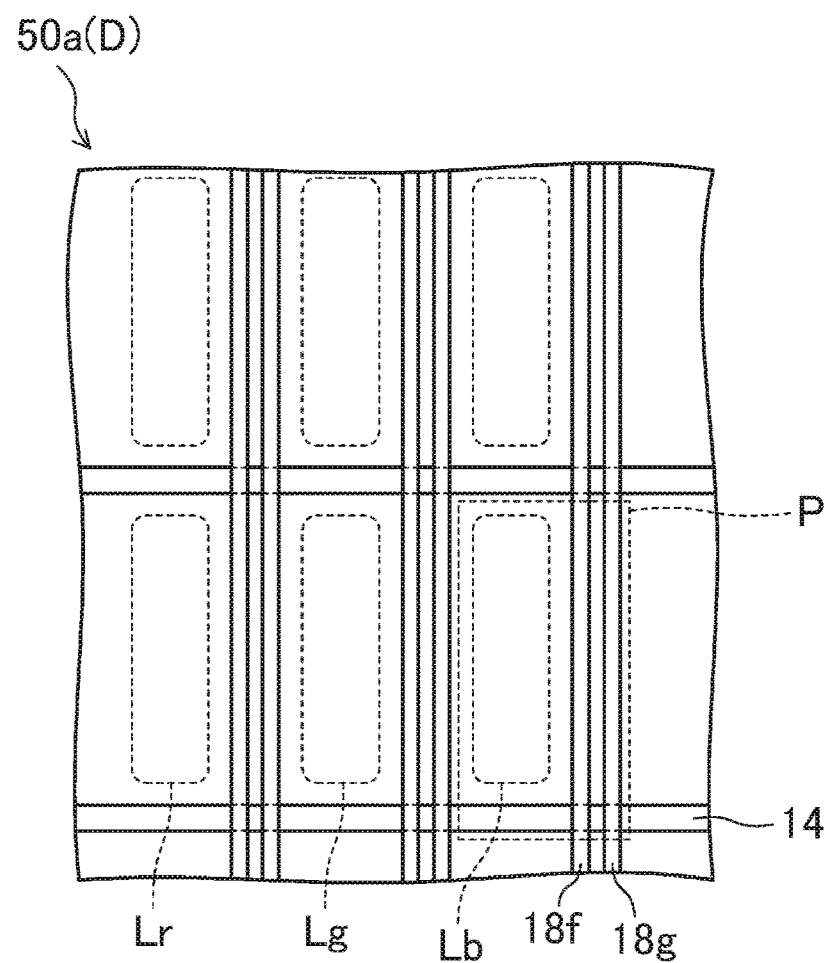
FIG. 2 is a plan view of a display area of the organic EL display device in accordance with the first embodiment of the present invention.
Figure 3:
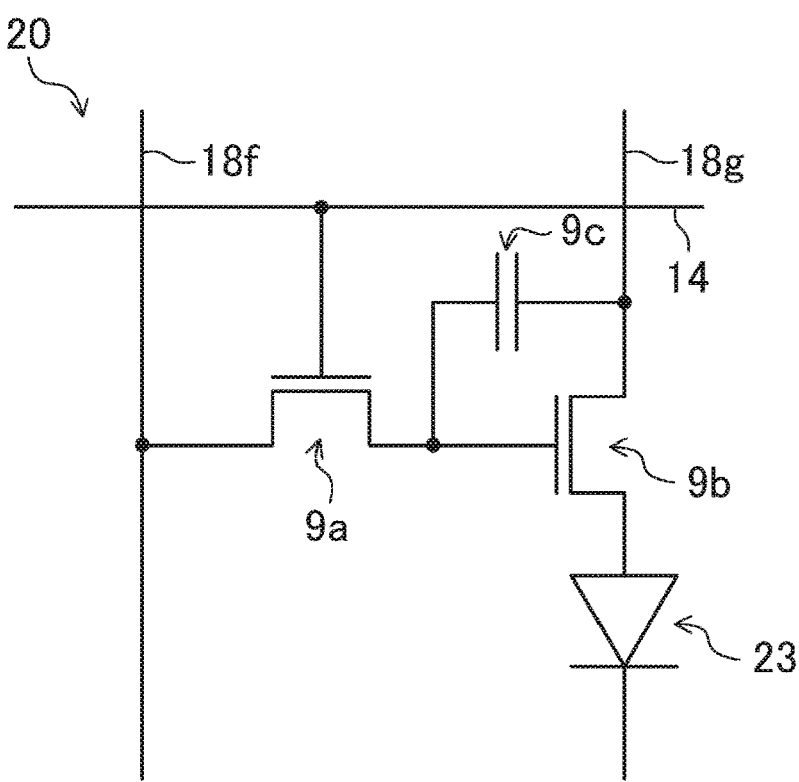
FIG. 3 is an equivalent circuit diagram of a TFT layer in the organic EL display device in accordance with the first embodiment of the present invention.
Figure 4:
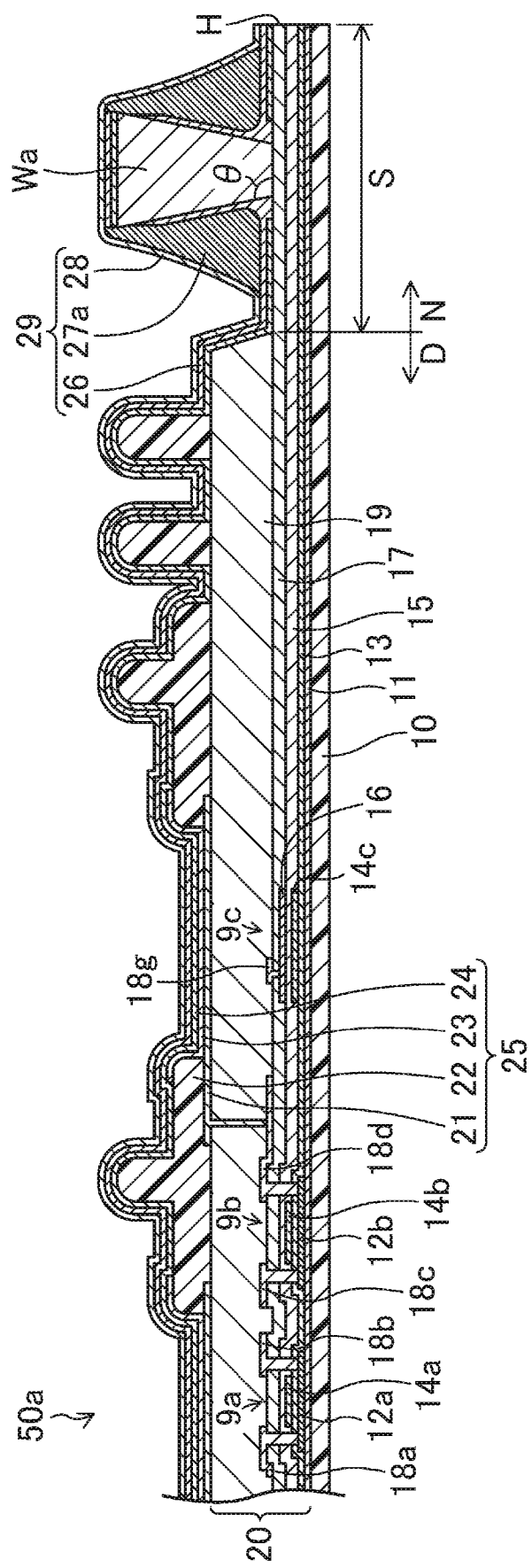
FIG. 4 is a cross-sectional view of the organic EL display device taken along line IV-IV in FIG. 1.
Figure 5:
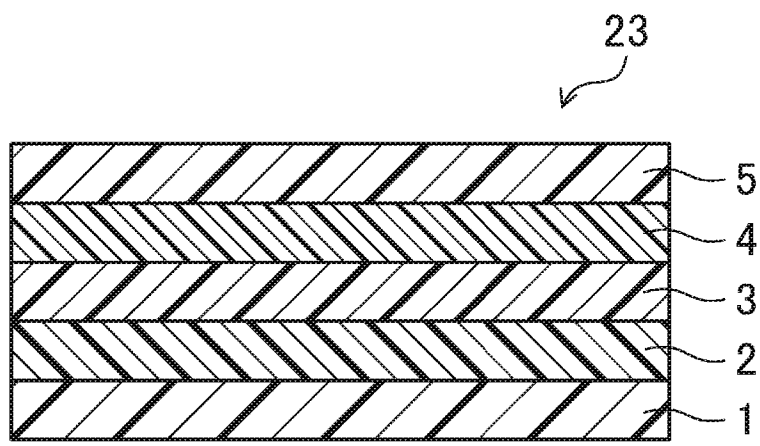
FIG. 5 is a cross-sectional view of an organic EL layer in the organic EL display device in accordance with the first embodiment of the present invention.

FIGS. 1 to 6 illustrate a first embodiment of a display device and a method of manufacturing a display device in accordance with the present invention. This and subsequent embodiments will discuss an organic EL display device including organic EL elements as an example of the display device including light-emitting elements. FIG. 1 is a schematic plan view of a structure an organic EL display device 50*a* in accordance with the present embodiment. FIG. 2 is a plan view of a display area D of the organic EL display device 50*a*. FIG. 3 is an equivalent circuit diagram of a TFT layer 20 in the organic EL display device 50*a*. FIG. 4 is a cross-sectional view of the organic EL display device 50*a* taken along line IV-IV in FIG. 1. FIG. 5 is a cross-sectional view of an organic EL layer 23 in the organic EL display device 50a.

The organic EL display device 50a, as shown in FIG. 1, includes the rectangular display area D for displaying an image and a frame area F (hatched in the figure) shaped like a frame surrounding the display area D.

In the display area D, there are provided an organic EL element 25 (detailed later). Further, as shown in FIG. 2, a plurality of subpixels P are disposed in a matrix shape in the display area D. In the display area D, a subpixel P including a red-light-emitting region Lr for a grayscale display in red, a subpixel P including a green-light-emitting region Lg for a grayscale display in green, and a subpixel P including a blue-light-emitting region Lb for a grayscale display in blue are provided adjacent to each other as shown in FIG. 2. Each pixel in the display area D is formed by three adjacent subpixels P including the red-light-emitting region Lr, the green-light-emitting region Lg, and the blue-light-emitting region Lb respectively There is also provided an insular non-display area N in the display area D as shown in FIG. 1.

The non-display area N has a through hole H that runs through a resin substrate layer 10 (detailed later) in the thickness direction of the resin substrate layer 10 as shown in FIGS. 1 and 4, for example, so that a camera or a fingerprint sensor can be disposed in the non-display area N. There is also provided an inner circular wall Wa around the non-display area N as shown in FIGS. 1 and 4. The inner circular wall Wa protrudes in the thickness direction of the resin substrate layer 10 and extends like a circular frame along the boundary between the non-display area N and the display area D. The inner circular wall Wa includes, for example, a stack of a lower layer formed of the same material and in the same layer as a planarization film 19 (detailed later) and an upper layer formed of the same material and in the same layer as an edge cover 22 (detailed later). The bottom face and each side face of the inner circular wall Wa form an angle θ of approximately 70° to 150° in lateral cross-sectional view. These side faces are reverse-tapered in lateral cross-sectional view as shown in FIG. 4 (preferably exactly as in FIG. 4). The sidewall of the through hole H is separated from the edge of the display area D by a distance S of approximately 20 μm to 100 μm. If the organic film between a first inorganic film and a second inorganic film in the sealing film is formed by inkjet technology, two structural bodies, each equivalent to the inner circular wall Wa, are required to dam the organic films. Therefore, the corresponding distance from the sidewall of the through hole to the edge of the display area is approximately 600 μm.

As shown in FIG. 1, the frame area F has a terminal region T on the bottom side of the figure. The frame area F also has a bendable portion B between the display area D and the terminal region T along a side of the display area D (along the bottom side in the figure). The bendable portion B can be bent 180° in the lateral direction in the figure (to form a U-shape). The organic EL display device 50a includes the bendable portion B in the present embodiment, but may alternatively include no bendable portion B.

The organic EL display device 50a, as shown in FIG. 4, includes the resin substrate layer 10, the organic EL elements 25, and a sealing film 29. The resin substrate layer 10 serves as a flexible base substrate. The organic EL elements 25 reside on the resin substrate layer 10 with the TFT (thin film transistor) layer 20 intervening therebetween and serve as light-emitting elements. The sealing film 29 is provided so as to cover the organic EL element 25.

The resin substrate layer 10 is made of, for example, polyimide resin.

The TFT layer 20 includes: a base coat film 11 on the resin substrate layer 10; a plurality of first TFTs 9a, a plurality of second TFTs 9b, and a plurality of capacitors 9c on the base coat film 11; and the planarization film 19 on the first TFTs 9a, the second TFTs 9b, and the capacitors 9c as shown in FIG. 4. The TFT layer 20 includes therein a plurality of gate lines 14 extending parallel to each other in the lateral direction in the figure as shown in FIGS. 2 and 3. The TFT layer 20 further includes therein a plurality of source lines 18f extending parallel to each other in the vertical direction in the figure as shown in FIGS. 2 and 3. The TFT layer 20 further includes a plurality of power supply lines 18g extending adjacent to the source lines 18f and parallel to each other in the vertical direction in the figure as shown in FIGS. 2 and 3. The TFT layer 20 further includes the first TFTs 9a, the second TFTs 9b, and the capacitors 9c, one each in every subpixel P as shown in FIG. 3.

The base coat film 11 includes a single inorganic insulating film of, for example, silicon nitride, silicon oxide, or silicon oxynitride or a stack of any of these inorganic insulating films.

Each first TFT 9a is connected to the associated one of the gate lines 14 and the associated one of the source lines 18f in the subpixel P as shown in FIG. 3. The first TFT 9a includes: a semiconductor layer 12a provided in an insular manner on the base coat film 11; a gate insulating film 13 provided so as to cover the semiconductor layer 12a; a gate electrode 14a provided on the gate insulating film 13 so as to overlap a part of the semiconductor layer 12a; a first interlayer insulating film 15 and a second interlayer insulating film 17 provided sequentially so as to cover the gate electrode 14a; and a source electrode 18a and a drain electrode 18b provided on the second interlayer insulating film 17 so as to be separated from each other, as shown in FIG. 4. The gate insulating film 13, the first interlayer insulating film 15, and the second interlayer insulating film 17 each include a single inorganic insulating film of, for example, silicon nitride, silicon oxide, or silicon oxynitride or a stack of any of these inorganic insulating films.

Each second TFT 9b is connected to the associated one of the first TFTs 9a and the associated one of the power supply lines 18g in the subpixel P as shown in FIG. 3. The second TFT 9b includes: a semiconductor layer 12b provided in an insular manner on the base coat film 11; the gate insulating film 13 provided so as to cover the semiconductor layer 12b; a gate electrode 14b provided on the gate insulating film 13 so as to overlap a part of the semiconductor layer 12b; the first interlayer insulating film 15 and the second interlayer insulating film 17 provided sequentially so as to cover the gate electrode 14b; and a source electrode 18c and a drain electrode 18d provided on the second interlayer insulating film 17 so as to be separated from each other, as shown in FIG. 4.

The first TFTs 9a and the second TFTs 9b are top-gate TFTs in the present embodiment, but may alternatively be bottom-gate TFTs.

Each capacitor 9c is connected to the associated one of the first TFTs 9a and the associated one of the power supply lines 18g in the subpixel P as shown in FIG. 3. The capacitor 9c includes: a lower conductive layer 14c formed of the same material and in the same layer as the gate electrode; the first interlayer insulating film 15 provided so as to cover the lower conductive layer 14c; and an upper conductive layer 16 provided on the first interlayer insulating film 15 so as to overlap the lower conductive layer 14c, as shown in FIG. 4. The upper conductive layer 16 is connected to the power supply line 18g via a contact hole provided through the second interlayer insulating film 17 as shown in FIG. 4.

The planarization film 19 is made of a colorless, transparent organic resin material such as polyimide resin.

The organic EL elements 25 include a plurality of first electrodes 21, the edge cover 22, a plurality of organic EL layers 23, and a second electrode 24 provided sequentially on the planarization film 19 as shown in FIG. 4.

The first electrodes 21, one for each subpixel P, are provided as reflective electrodes (anodes) in a matrix on the planarization film 19 as shown in FIG. 4. The first electrode 21 is connected to the drain electrode 18d of the second TFT 9b via a contact hole formed through the planarization film 19 as shown in FIG. 4. The first electrode 21 has a function of injecting holes to the organic EL layer 23. The first electrode 21 is preferably formed of a material that has a large work function in order to improve the efficiency of hole injection to the organic EL layer 23. The first electrodes 21 is made of, for example, a metal material such as silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), or lithium fluoride (LiF). Alternatively, the first electrodes 21 may be made of, for example, an alloy such as a magnesium-copper (Mg—Cu) alloy, a magnesium-silver (Mg—Ag) alloy, a sodium-potassium (Na—K) alloy, an astatine-astatine oxide (At—AtO$_2$) alloy, a lithium-aluminum (Li—Al) alloy, a lithium-calcium-aluminum (Li—Ca—Al) alloy, or a lithium fluoride-calcium-aluminum (LiF—Ca—Al) alloy. As another alternative, the first electrodes 21 may be made of, for example, an electrically conductive oxide such as tin oxide (SnO), zinc oxide (ZnO), indium tin oxide (ITO), or indium zinc oxide (IZO). As a further alternative, the first electrodes 21 may be a stack of layers of any of these materials. The material that has a large work function may be, for example, indium tin oxide (ITO) or indium zinc oxide (IZO).

The edge cover 22 is arranged to form a lattice covering the peripheral portions of the first electrodes 21 as shown in FIG. 4. The edge cover 22 is made of, for example, an organic film such as a film of polyimide resin, acrylic resin, polysiloxane resin, or novolac resin.

The organic EL layers 23, one for each subpixel, are arranged in a matrix on the first electrodes 21 as shown in FIG. 4. Each organic EL layer 3 includes a hole injection layer 1, a hole transport layer 2, a light-emitting layer 3, an electron transport layer 4, and an electron injection layer 5 provided sequentially on the first electrode 21 as shown in FIG. 5. The hole injection layer 1, the hole transport layer 2, the light-emitting layer 3, the electron transport layer 4, and the electron injection layer 5 are, for example, vapor deposition films formed by vacuum vapor deposition.

The hole injection layer 1 is alternatively referred to as the anode buffer layer and has a function of bringing the energy levels of the first electrode 21 and the organic EL layer 23 closer to each other to improve the efficiency of hole injection from the first electrode 21 to the organic EL layer 23. The hole injection layer 1 is made of, for example, a triazole derivative, an oxadiazole derivative, an imidazole derivative, a polyaryl alkane derivative, a pyrazoline derivative, a phenylenediamine derivative, an oxazole derivative, a styrylanthracene derivative, a fluorenone derivative, a hydrazone derivative, or a stilbene derivative.

The hole transport layer 2 has a function of improving the efficiency of hole transport from the first electrode 21 to the organic EL layer 23. The hole transport layer 2 is made of, for example, a porphyrin derivative, an aromatic tertiary amine compound, a styrylamine derivative, polyvinylcarbazole, poly-p-phenylenevinylene, polysilane, a triazole derivative, an oxadiazole derivative, an imidazole derivative, a polyaryl alkane derivative, a pyrazoline derivative, a pyrazolone derivative, a phenylenediamine derivative, an arylamine derivative, an amine-substituted chalcone derivative, an oxazole derivative, a styrylanthracene derivative, a fluorenone derivative, a hydrazone derivative, a stilbene derivative, hydrogenated amorphous silicon, hydrogenated amorphous silicon carbide, zinc sulfide, or zinc selenide.

The light-emitting layer 3 is injected with holes and electrons from the first electrode 21 and the second electrode 24 respectively when the light-emitting layer 3 is under the voltage applied by the first electrodes 21 and the second electrodes 24. The injected holes and electrons recombine in the light-emitting layer 3. The light-emitting layer 3 is made of a material that has a high light-emitting efficiency. The light-emitting layer 3 is made of, for example, a metal oxynoid compound [8-hydroxyquinoline metal complex], a naphthalene derivative, an anthracene derivative, a diphenylethylene derivative, a vinylacetone derivative, a triphenylamine derivative, a butadiene derivative, a coumarin derivative, a benzoxazole derivative, an oxadiazole derivative, an oxazole derivative, a benzimidazole derivative, a thiadiazole derivative, a benzthiazole derivative, a styryl derivative, a styrylamine derivative, a bis(styryl)benzene derivative, a tris(styryl)benzene derivative, a perylene derivative, a perynone derivative, an aminopyrene derivative, a pyridine derivative, a rhodamine derivative, an acridine derivative, phenoxazone, a quinacridone derivative, rubrene, poly-p-phenylenevinylene, or polysilane.

The electron transport layer 4 has a function of efficiently transporting electrons to the light-emitting layer 3. The electron transport layer 4 is made of, for example, an organic compound such as an oxadiazole derivative, a triazole derivative, a benzoquinone derivative, a naphthoquinone derivative, an anthraquinone derivative, a tetracyanoanthraquinodimethane derivative, a diphenoquinone derivative, a fluorenone derivative, a silole derivative, or a metal oxynoid compound.

The electron injection layer 5 has a function of bringing the energy levels of the second electrode 24 and the organic EL layer 23 closer to each other to improve the efficiency of electron injection from the second electrode 24 to the organic EL layer 23. This function can lower the drive voltage of the organic EL element 25. The electron injection layer 5 is alternatively referred to as the cathode buffer layer. The electron injection layer 5 is made of, for example, an inorganic alkali compound such as lithium fluoride (LiF), magnesium fluoride (MgF$_2$), calcium fluoride (CaF$_2$), strontium fluoride (SrF$_2$), or barium fluoride (BaF$_2$); aluminum oxide (Al$_2$O$_3$); or strontium oxide (SrO).

The second electrode 24 (represented by a dot in FIG. 1) serves as a common electrode (cathode) covering the organic EL layer 23 and the edge cover 22 as shown in FIGS. 1 and 4. The second electrodes 24 (represented by dots in the figure) are provided in the non-display area N as well as in the display area D as shown in FIG. 1. The second electrode 24 has a function of injecting electrons to the organic EL layer 23. The second electrode 24 is preferably formed of a material that has a small work function in order to improve the efficiency of electron injection to the organic EL layer 23. The second electrode 24 is, for example, a vapor deposition film formed by vacuum vapor deposition. The second electrodes 24 are made of, for example, silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), or lithium fluoride (LiF). Alternatively, the second electrodes 24 may be made of, for example, an alloy such as a magnesium-copper (Mg—Cu) alloy, a magnesium-silver (Mg—Ag) alloy, a sodium-potassium (Na—K) alloy, an astatine-astatine oxide (At—AtO$_2$) alloy, a lithium-aluminum (Li—Al) alloy, a lithium-calcium-aluminum (Li—Ca—Al) alloy, or a lithium fluoride-calcium-aluminum (LiF—Ca—Al) alloy. As another alternative, the second electrodes 24 may be made of, for example, an electrically conductive oxide such as tin oxide (SnO), zinc oxide (ZnO), indium tin oxide (ITO), or indium zinc oxide (IZO). As a further alternative, the second electrodes 24 may be a stack of layers of any of these materials. The material that has a small work function may be, for example, magnesium (Mg), lithium (Li), lithium fluoride (LiF), magnesium-copper (Mg—Cu), magnesium-silver (Mg—Ag), sodium-potassium (Na—K), lithium-aluminum lithium-calcium-aluminum (Li—Ca—Al), or lithium fluoride-calcium-aluminum (LiF—Ca—Al).

The sealing film 29 includes: a first inorganic film 26 provided so as to cover the second electrode 24; organic buffer layers 27a and 27b (see FIG. 6(d) which will be described later) provided on the first inorganic film 26; and a second inorganic film 28 provided on the first inorganic film 26 so as to cover the organic buffer layers 27a and 27b, as shown in FIG. 4. The sealing film 29 has a function of protecting the organic EL layers 23 from, for example, water and oxygen. The first inorganic film 26 and the second inorganic film 28 are made of, for example, an inorganic material such as silicon oxide (SiO$_2$), aluminum oxide (Al$_2$O$_3$), silicon nitride (SiNx where x is a positive number) (e.g., trisilicon tetranitride (Si$_3$N$_4$)), or silicon carbide nitride (SiCN). The organic buffer layers 27a and 27b are made of, for example, an organic material such as acrylate, polyurea, parylene, polyimide, or polyamide. The organic buffer layer 27a is interposed between the first inorganic film 26 and the second inorganic film 28 on both side faces of the inner circular wall Wa in the non-display area N as shown in FIG. 4. Because the first inorganic film 26 is tapered due to the lateral cross-sectional shape of the inner circular wall Wa, the top portion of the organic buffer layer 27a is in contact with the side faces of the inner circular wall Wa as shown in FIG. 4. In addition, because the second electrode 24 is provided in the non-display area N as well as in the display area D and tapered due to the lateral cross-sectional shape of the inner circular Wa in the non-display area N, the second electrode 24 is provided also between the top face of the inner circular wall Wa and the first inorganic film 26 as shown in FIG. 4. The organic buffer layer 27b is provided over the surface of a foreign object X adhering to the first inorganic film 26 as shown in FIG. 6(d).

The organic EL display device 50a described above is arranged in each subpixel P to turn on the first TFT 9a by inputting a gate signal to the first TFT 9a via the-gate line 14 and apply a prescribed voltage corresponding to a source signal to the gate electrode 14b and the capacitor 9c of the second TFT 9b via the source line 18f to specify the magnitude of the current from the power supply line 18g on the basis of the gate voltage of the second TFT 9b, so that the specified current is fed to the organic layer 23, thereby causing the light-emitting layer 3 in the organic EL layer 23 to emit light to display an image. In the organic EL display device 50a, the gate voltage of the second TFT 9b is retained by the capacitor 9c even if the first TFT 9a is turned off. The light-emitting layer 3 therefore continuously emits light until a gate signal is inputted in the next frame.

Figure 6:
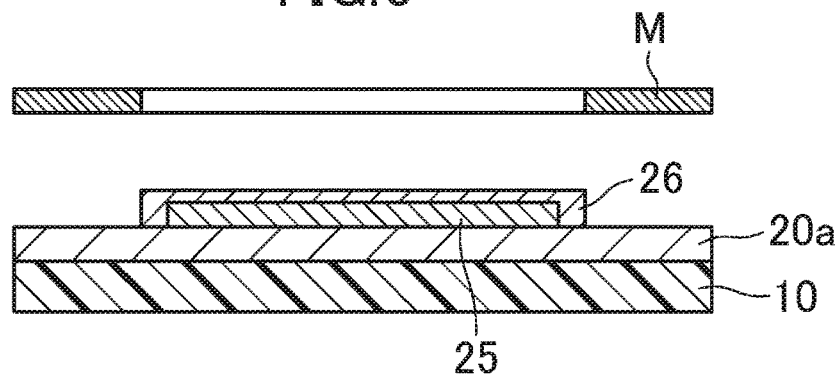
FIG. 6 is a set of cross-sectional views showing a sealing film forming step of a method of manufacturing the organic EL display device in accordance with the first embodiment of the present invention.
Figure 6:
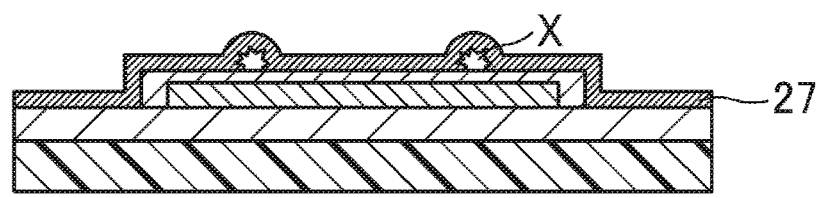
Figure 6:
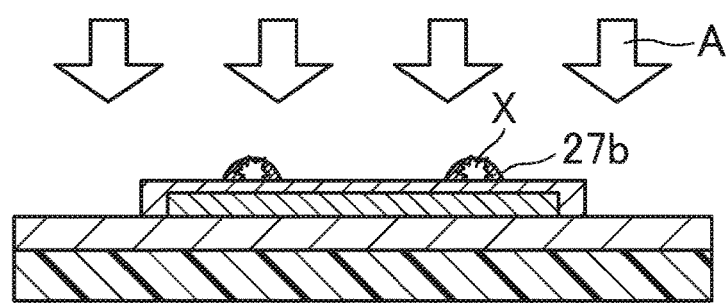
Figure 6:
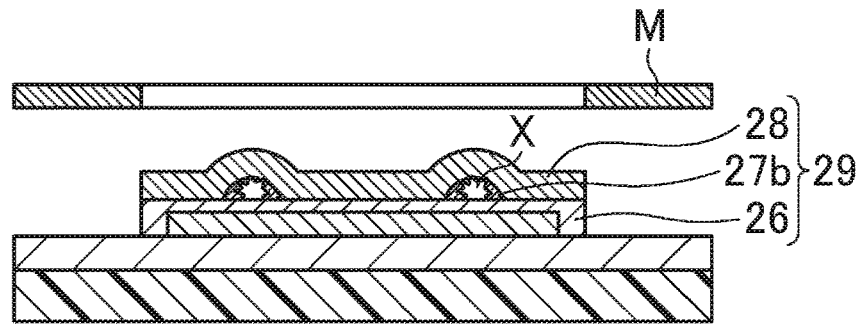

Next will be described a method of manufacturing the organic EL display device 50a in accordance with the present embodiment with reference to FIG. 6. FIG. 6 is a set pf cross-sectional views showing a sealing film forming step of a method of manufacturing the organic EL display device 50a. FIGS. 6(a), 6(b), 6(c), and 6(d) are cross-sectional views showing a first inorganic film forming step, an organic film forming step, an ashing step, and a second inorganic film forming step. The method of manufacturing the organic EL display device 50a in accordance with the present embodiment includes: a TFT layer forming step; a light-emitting element forming step including an inner circular watt forming step; a sealing film forming step including a first inorganic film forming step, an organic film forming step, aft ashing step, and a second inorganic film forming step; a flexibilization step; and a through-hole forming step.

TFT Layer Forming Step

The TFT layer 20 is formed, for example, by forming the base coat film 11, the first TFTs 9a, the second TFTs 9b, the capacitors 9c, and the planarization film 19 on a surface of the resin substrate layer 10 on a glass substrate by a well-known method.

Light-Emitting Element Forming Step

The organic EL element 25 is formed by forming the first electrodes 21, the edge cover 22, the organic EL layers 23 (the hole injection layer 1, the hole transport layer 2, the light-emitting layer 3, the electron transport layer 4, and the electron injection layer 5), and the second electrodes 24 on the TFT layer 20 formed in the TFT layer forming step by a well-known method. The inner circular wall Wa is formed, for example, by patterning (exposing to light, developing, and baking) a photosensitive resin film used in forming the planarization film 19 in the TFT layer forming step and a photosensitive resin film used in forming the edge cover 22 in this light-emitting element forming step in either a single step or two steps (inner circular wall forming step).

Sealing Film Forming Step

First, as shown in FIG. 6(a), an inorganic insulating film such as a silicon nitride film is formed with a thickness of approximately 1,000 nm on the surface of the substrate now carrying the organic EL element 25 formed thereon in the light-emitting element forming step by plasma CVD using a mask M, to form a first inorganic layer 26 (first inorganic film forming step).

Subsequently, as shown in FIG. 6(b), an organic film 27 is formed of an organic material such as acrylate with a thickness of approximately 200 nm on the surface of the substrate now carrying the first inorganic layer 26 thereon, for example, by vacuum vapor deposition (organic film forming step).

Thereafter, as shown in FIG. 6(c), the organic film 27 is ashed by plasma A to form the organic buffer layers 27a (see FIG. 4) and 27b (asking step). The organic film 27 is mostly removed by the ashing under plasma A, but survives the ashing and remains on the side faces of the inner circular watt Wa and on the surface of the foreign object X, to form the organic huller layers 27a and 27b.

An inorganic insulating film such as a silicon nitride film is then formed with a thickness of approximately 500 nm on the surface of the substrate now carrying the organic buffer layers 27a and 27b thereon, for example, by plasma CVD using the mask M to form the second inorganic film 28 in such a manner as to overlap the first inorganic film 26 as shown in FIG. 6(d), thereby forming the sealing film 29 (second inorganic film forming step).

Flexibilization Step

A laser beam scans the glass substrate side of the substrate now carrying the sealing film 29 formed thereon in the sealing film forming step, to detach the glass substrate from the resin substrate layer 10.

Through-Hole Forming Step

For example, a laser beam circularly scans the area surrounded by the inner circular wall Wa on the substrate from which the glass substrate is detached in the flexibilization step, to form the through hole H.

The organic EL display device 50a in accordance with the present embodiment can be manufactured by these steps.

As described above, according to the organic EL display device 50a and the method of manufacturing the organic EL display device 50a in accordance with the present embodiment, the frame-shaped inner circular wall Wa that protrudes in the thickness direction of the resin substrate layer 10 and extends along the boundary between the non-display area N and the display area D is formed in the insular non-display area N in the display area D in the inner circular wall forming step. Furthermore, in the sealing film forming step, after the organic buffer layer 27b is formed on the side faces of the inner circular wall Wa with the first inorganic film 26 intervening therebetween, the second inorganic film 28 is formed. In the sealing film forming step, the organic film 27 formed by vapor deposition in such a manner as to cover the first inorganic film 26 is ashed to form the organic buffer layer 27a on the side faces of the inner circular wall Wa with the first inorganic film 26 intervening therebetween in the non-display area N and to form the organic buffer layer 27b on the surface of the foreign object X adhering to the first inorganic film 26 primarily in the display area D. Therefore, the sealing structure provided by the sealing film 29 formed by a stack of the first inorganic film 26, the organic buffer layer 27b, and the second inorganic film 28 in the display area D is terminated by the inner circular wall Wa in the non-display area N. In this sealing structure terminated by the inner circular wall Wa in the non-display area N, the organic buffer layer 27a, provided on the side faces of the inner circular wall Wa, ensures that the second inorganic film 28 covers the first inorganic film 26. The sealing capability of the sealing film 29 can be thus guaranteed even if the insular non-display area N is provided in the display area D in the organic EL display device 50a.

Additionally, according to the organic EL display device 50a and the method of manufacturing the organic EL display device 50a in accordance with the present embodiment, since the bottom face and each side face of the inner circular wall Wa form an angle θ of 70° to 150° in lateral cross-sectional view, the first inorganic film 26 and the vapor deposition film such as the second electrodes 24 are tapered due to the lateral cross-sectional shape of the inner circular wall Wa. Since the second inorganic film 28 is formed so as to cover the first inorganic film 26 and the organic buffer layer 27a in the second inorganic film forming step in the sealing film forming step, the sealing capability of the sealing film 29 can be guaranteed even if the top portion of the organic buffer layer 27a is in contact with the inner circular wall Wa. Furthermore, since the vapor deposition film such as the second electrodes 24 is tapered due to the inner circular wall Wa, it is possible to form a holed structure in the vapor deposition film by patterning without having to use a mask having an insular structure and to restrict water penetration to the organic EL element 25 through the vapor deposition film.

Second Embodiment

Figure 7:
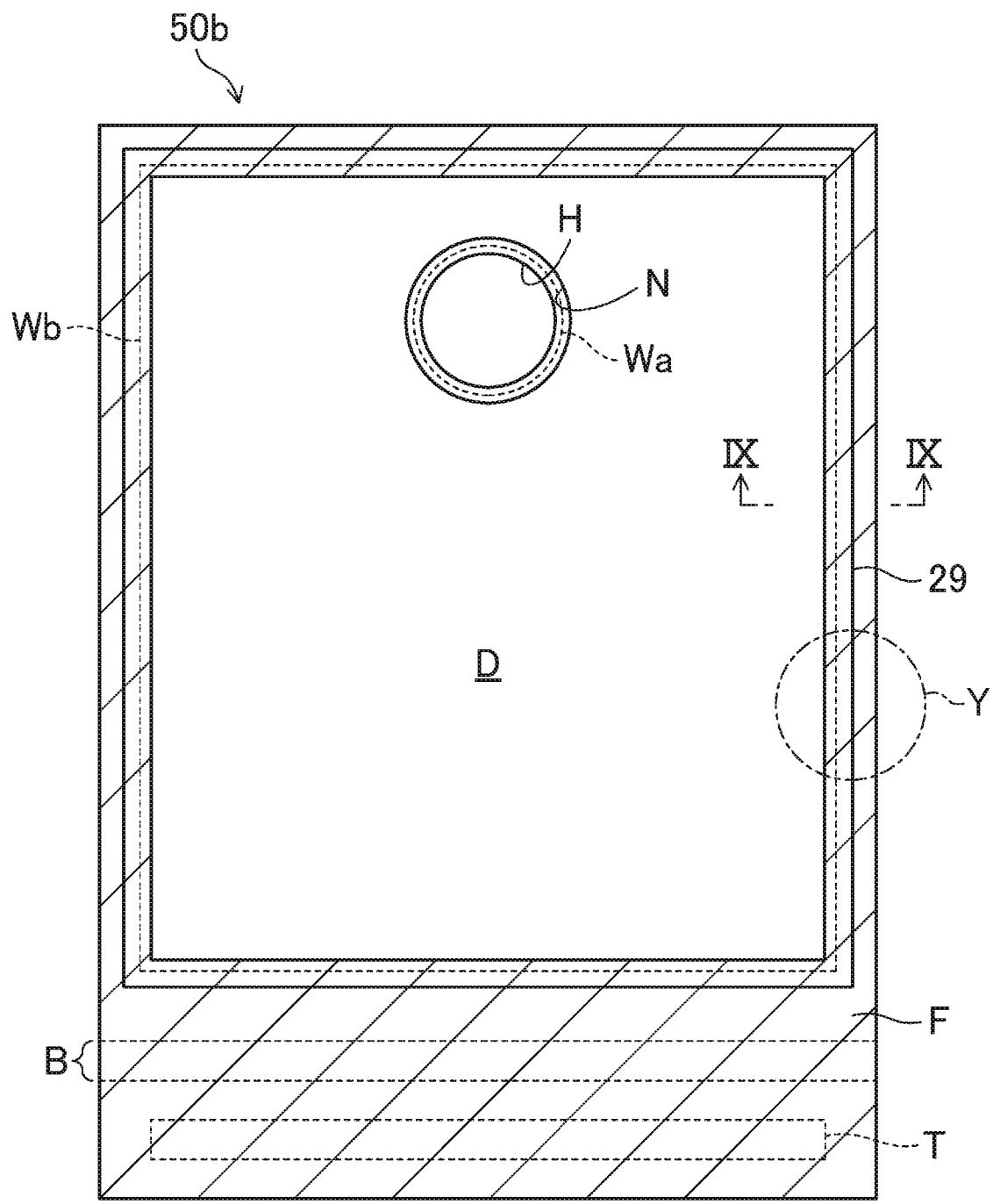
FIG. 7 is a schematic plan view of a structure of an organic EL display device in accordance with a second embodiment of the present invention.
Figure 8:
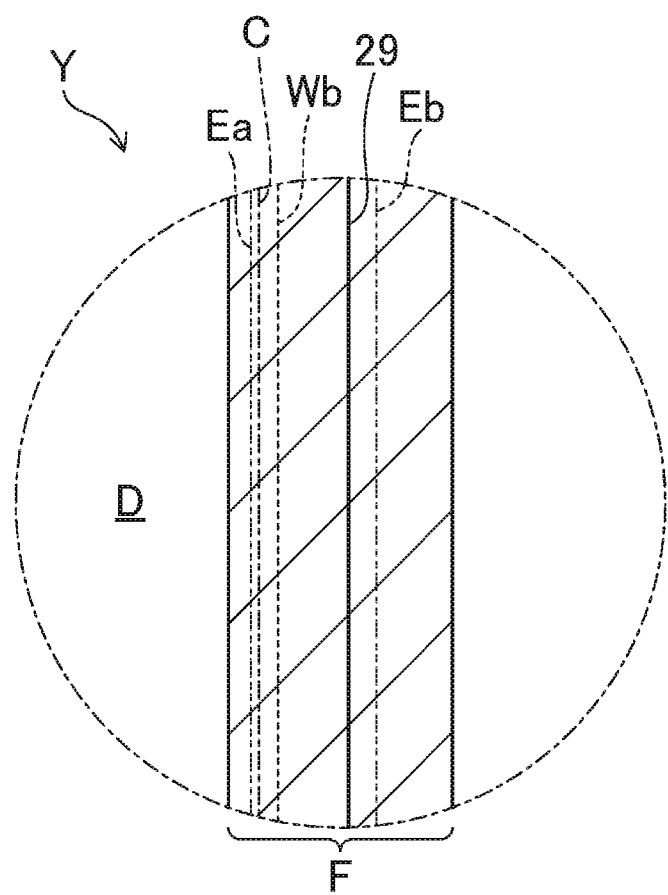
FIG. 8 is an enlarged plan view of a region Y in FIG. 7.
Figure 9:
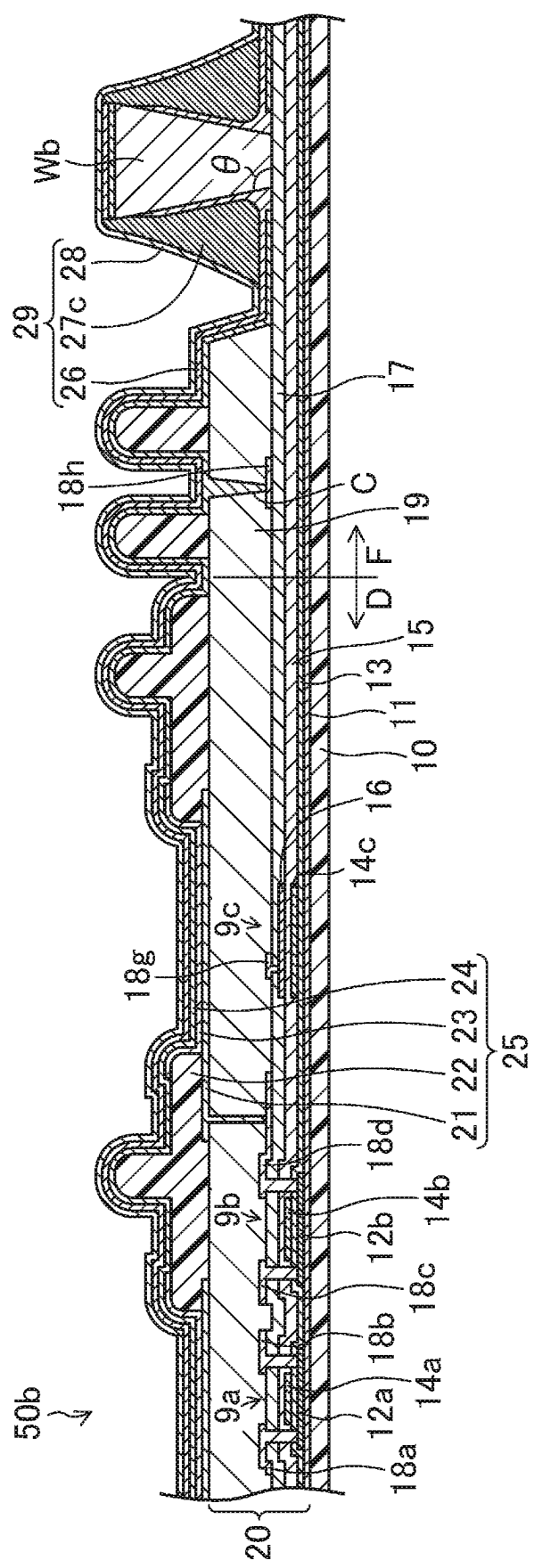
FIG. 9 is a cross-sectional view of the organic EL display device taken along line IX-IX in FIG. 7.

FIGS. 7 to 9 illustrate a second embodiment of a display device and a method of manufacturing a display device in accordance with the present invention. FIG. 7 is a schematic plan view of a structure of an organic EL display device 50b in accordance with the present embodiment. FIG. 8 is an enlarged plan view of a region Y in FIG. 7. FIG. 9 is a cross-sectional view of the organic EL display device 50b taken along line IX-IX in FIG. 7. Members of this and subsequent embodiments that are the same as those shown in FIGS. 1 to 6 are indicated by the same reference signs or numerals, and detailed description thereof is omitted.

The first embodiment discloses as an example the organic EL display device 50a including the inner circular wall Wa in the non-display area N. The present embodiment discloses as an example the organic EL display device 50b including the inner circular wall Wa in the non-display area N and an outer circular wall Wb in the frame area F.

The organic EL display device 50b, as shown in FIG. 7, includes the rectangular display area D and a frame area F (hatched in the figure) shaped like a frame surrounding the display area D.

The outer circular wall Wb protrudes in the thickness direction of the resin substrate layer 10 and is provided in the frame area F like a rectangular frame along the boundary between the frame area F and the display area D as shown in FIGS. 7 and 9. The outer circular wall Wb includes, for example, a stack of a lower layer formed of the same material and in the same layer as the planarization film 19 and an upper layer formed of the same material and in the same layer as the edge cover 22. The bottom face and each side face of the outer circular wall Wb form an angle θ of approximately 70° to 150° in lateral cross-sectional view. These side faces are reverse-tapered in lateral cross-sectional view as shown in FIG. 9. The planarization film 19 has a slit C in the frame area F to connect the second electrodes 24 to a source conductive layer (wiring) 18h as shown in FIGS. 8 and 9.

The first inorganic film 26 and the vapor deposition film such as the second electrodes 24 formed by vacuum vapor deposition as described in the first embodiment are tapered due to the lateral cross-sectional shape of the outer circular wall Wb in the frame area. F. The vapor deposition film is formed using either a fine metal mask (FMM) enabling patterning on a subpixel-to-subpixel basis or a common metal mask (CMM) enabling patterning on a panel-to-panel basis. Examples of the insular vapor deposition film formed using a FMM include the light-emitting layer 3. Examples of the common vapor deposition film formed using a CMM include the hole injection layer 1, the hole transport layer 2, the electron transport layer 4, the electron injection layer 5, an electron blocking layer, a hole blocking layer, and the second electrodes 24. The common vapor deposition film formed using a CMM, if interposed between the second electrodes 24 and the source conductive layer 18h, increases electric resistance. Therefore, the openings in the CMM used to form the second electrodes 24 need to be larger than the openings in the CMM used to form a common vapor deposition film other than the second electrodes 24. For this reason, in FIG. 8, the common vapor deposition film formed using a CMM other than the second electrode 24 has a rim denoted by Ea, and the second electrode 24 and the vapor deposition film formed using a FMM have a rim denoted by Eb. The outer circular wall Wb electrically insulates the second electrodes 24 formed outside the sealing film 29 from the second electrodes 24 formed in the display area D. In FIG. 8, a vapor deposition film formed using a CMM or a FMM other than the second electrode 24 may have a rim denoted by Ea, and the second electrode 24 may have a rim denoted by Eb. As another alternative, the sealing film may have an end portion denoted by Eb, and the second electrode may have an end portion denoted by 29.

The organic EL display device 50b, as shown in FIG. 9, includes the resin substrate layer 10, the organic EL elements 25, and the sealing film 29. The organic EL elements 25 are provided as light-emitting elements on the resin substrate layer 10 with the TFT layer 20 intervening therebetween. The sealing film 29 is provided so as to cover the organic EL element 25.

The sealing film 29, as shown in FIG. 9, includes the first inorganic film 26, the organic buffer layers 27a, 27b, and 27c, and the second inorganic film 28 and has a function of protecting the organic EL layers 23 from, for example, water and oxygen. The first inorganic film 26 is provided so as to cover the second electrodes 24. The organic buffer layers 27a, 27b, and 27c are provided on the first inorganic film 26. The second inorganic film 28 is provided on the first inorganic film 26 so as to cover the organic buffer layers 27a, 27b, and 27c. The organic buffer layer 27c is made of, for example, an organic material such as acrylate, polyurea, parylene, polyimide, or polyamide. The organic buffer layer 27c is interposed between the first inorganic film 26 and the second inorganic film 28 on both the side faces of the outer circular wall Wb in the frame area F as shown in FIG. 9. Because the first inorganic film 26 is tapered due to the lateral cross-sectional shape of the outer circular wall Wb, the top portion of the organic buffer layer 27c is in contact with the side faces of the outer circular wall Wb as shown in FIG. 9. In addition, because the second electrode 24 is provided in the frame area F as well as in the display area D and tapered due to the lateral cross-sectional shape of the outer circular wall Wb in the frame area F, the second electrode 24 is provided also between the top face of the outer circular wall Wb and the first inorganic film 26 and outside the sealing film 29 as shown in FIG. 9.

Similarly to the organic EL display device 50a of the first embodiment, the organic EL display device 50b described above is flexible and arranged to cause the light-emitting layer 3 in the organic EL layer 23 to emit light in a suitable manner each subpixel P by using the first TFT 9a and the second TFT 9b, to display an image.

The organic EL display device 50b of the present embodiment can be manufactured by forming the outer circular wall Wb simultaneously with the inner circular wall Wa in the method of manufacturing the organic EL display device 50a of the first embodiment.

As described above, according to the organic EL display device 50b and the method of manufacturing the organic EL display device 50b in accordance with the present embodiment, the frame-shaped inner circular wall Wa is formed in the insular non-display area N in the display area D in the inner circular wall forming step, so as to protrude in the thickness direction of the resin substrate layer 10 and to extend along the boundary between the non-display area N and the display area D. Furthermore, the second inorganic film 28 is formed in the sealing film forming step after the organic buffer layer 27b is formed on the side faces of the inner circular wall Wa with the first inorganic film 26 intervening therebetween. In the sealing film forming step, the organic film 27 formed by vapor deposition so as to cover the first inorganic film 26 is ashed to form the organic buffer layer 27a on the side faces of the inner circular wall Wa with the first inorganic film 26 intervening therebetween in the non-display area N and to form the organic buffer layer 27b on the surface of the foreign object X adhering to the first inorganic film 26 primarily in the display area D. Therefore, the sealing structure provided by the sealing film 29 formed by a stack of the first inorganic film 26, the organic buffer layer 27b, and the second inorganic film 28 in the display area D is terminated by the inner circular wall Wa in the non-display area N. In this sealing structure terminated by the inner circular wall Wa in the non-display area N, the organic buffer layer 27a, provided on the side faces of the inner circular wall Wa, ensures that the second inorganic film 28 covers the first inorganic film 26. The sealing capability of the sealing film 29 can be thus guaranteed even if the insular non-display area N is provided in the display area D in the organic EL display device 50b.

Additionally, according to the organic EL display device 50b and the method of manufacturing the organic EL display device 50b in accordance with the present embodiment, since the bottom face and each side face of the inner circular wall Wa and the outer circular Wb form an angle greater than or equal to 70° in lateral cross-sectional view, the first inorganic film 26 and the vapor deposition film such as the second electrodes 24 are tapered due to the lateral cross-sectional shape of the inner circular wall Wa and the outer circular wall Wb. Since the second inorganic film 28 is formed so as to cover the first inorganic film 26 and the organic buffer layers 27a and 27c in the second inorganic film forming step in the sealing film forming step, the sealing capability of the sealing film 29 can be guaranteed even if the top portions of the organic buffer layers 27a and 27c are in contact with the inner circular wall Wa and the outer circular wall Wb respectively. Furthermore, since the vapor deposition film such as the second electrodes 24 is tapered due to the inner circular wall Wa and the outer circular wall Wb, it is possible to form a holed structure in the vapor deposition film by patterning without having to use a mask having an insular structure and to restrict water penetration to the organic EL element 25 through the vapor deposition film.

Additionally, according to the organic EL display device 50b and the method of manufacturing the organic EL display device 50b in accordance with the present embodiment, since the vapor deposition film such as the second electrodes 24 is tapered due to the outer circular wall Wb, the frame area F can be narrowed down.

Third Embodiment

Figure 10:
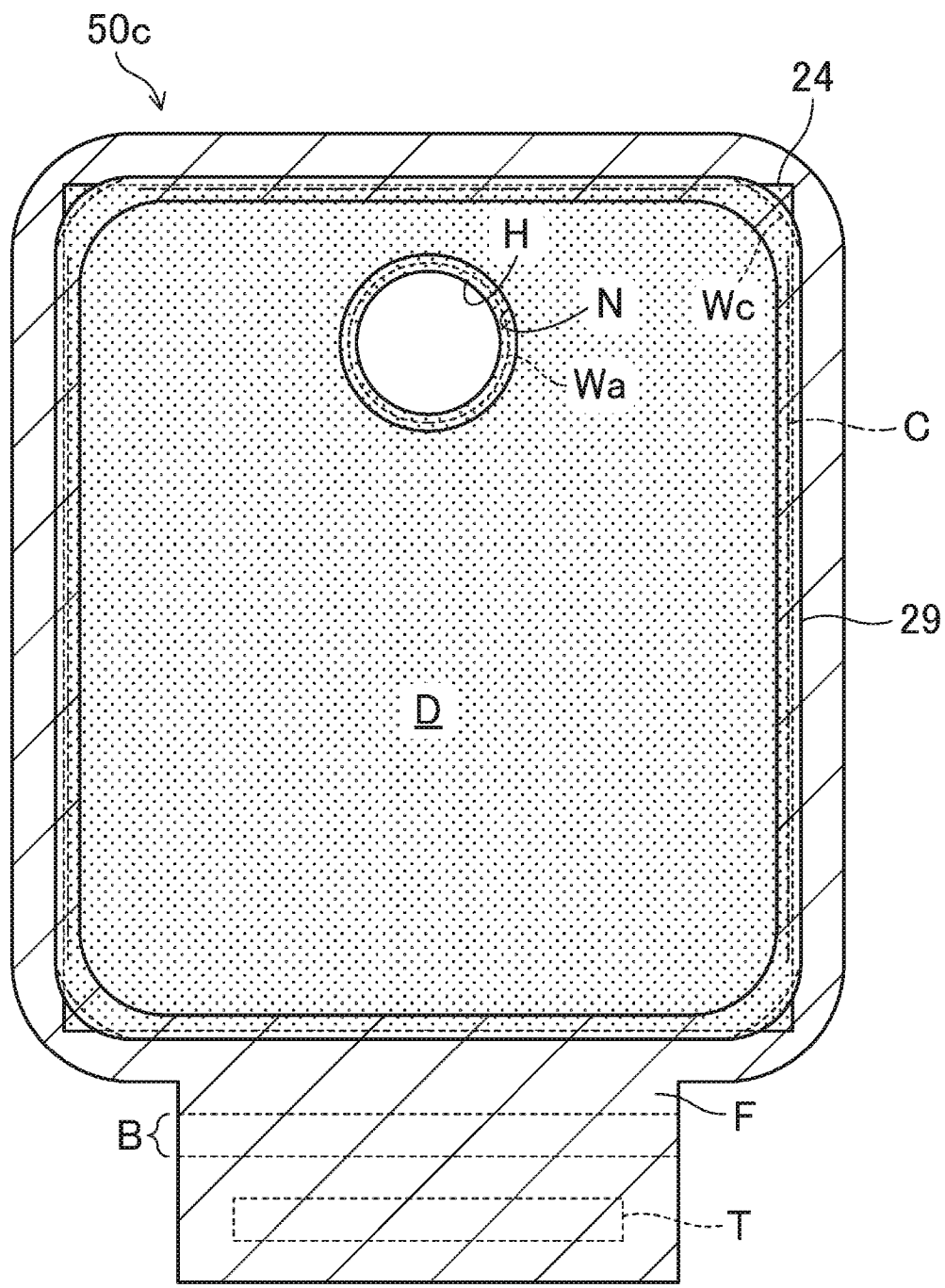
FIG. 10 is a schematic plan view of a structure of an organic EL display device in accordance with a third embodiment of the present invention.

FIG. 10 illustrates a third embodiment of a display device and a method of manufacturing a display device in accordance with the present invention. FIG. 10 is a schematic plan view of a structure of an organic display device 50c in accordance with the present embodiment.

The second embodiment discloses as an example the organic EL display device 50b including the frame-shaped outer circular watt Wb in the frame area F. The present embodiment discloses as an example the organic EL display device 50c including arc-shaped outer circular walls Wc in the frame area F.

The organic EL display device 50c, as shown in FIG. 10, is formed in a substantially T shape, and includes a rectangular display area D and the frame area F (hatched in the figure) surrounding the display area D. The display area D is shaped generally rectangular and has corners shaped like the letter R.

The frame area F includes the arc-shaped outer circular walls Wc, one in each corner of the display area D, that protrude in the thickness direction of the resin substrate layer 10 and extend along the boundary between the frame area F and the display area D as shown in FIG. 10. Each outer circular wall Wc includes, for example, a stack of a lower layer formed of the same material and in the same layer as the planarization film 19 and an upper layer formed of the same material and in the same layer as the edge cover 22. The bottom face and each side face of the outer circular wall Wc form an angle of approximately 70° to 150° in lateral cross-sectional view. These side faces are reverse-tapered in lateral cross-sectional view of the outer circular wall Wc. The present embodiment discusses an example where there is provided the outer circular wall Wc in each corner of the display area D. Alternatively, the display area D may have the outer circular wall Wc in any one of the four corners thereof.

The organic EL display device 50c, similarly to the organic EL display device 50b of the second embodiment, includes the resin substrate layer 10, the organic EL elements 25 as the light-emitting elements on the resin substrate layer 10 with the TFT layer 20 intervening therebetween, and the sealing film 29 provided so as to cover the organic EL elements 25. The second electrodes 24, which constitute common vapor deposition films in the organic EL elements 25, are tapered and provided beyond the outer circular walls Wc to the outside of the sealing film 29 in the corners Wc where there is provided an outer circular wall as shown in FIG. 10. The outer circular walls Wc hence electrically insulate the second electrodes 24 outside the sealing film 29 from the second electrodes 24 in the display area D. The present embodiment discusses an example where the second electrodes 24 formed using a CMM are provided beyond the outer circular walls Wc. Alternatively, there may be provided an insular vapor deposition film formed using a FMM beyond the outer circular walls Wc. In the organic EL display device 50c of the present embodiment, unlike in the organic EL display device 50b of the second embodiment where the outer circular wall Wb is provided along the entire periphery of the display area D, the end portions of the second electrodes 24 are located inside the peripheral edge of the sealing film 29 (on the display area D side) in the area other than the corners where the outer circular walls Wc are provided, as shown in FIG. 10.

Similarly to the organic EL display device 50a of the first embodiment, the organic EL display device 50c described above is flexible and arranged to cause the light-emitting layer 3 in the organic EL layer 23 to emit light in a suitable manner in each subpixel P by using the first TFT 9a and the second TFT 9b, to display an image.

The organic EL display device 50c of the present embodiment can be manufactured by forming the outer circular walls Wc simultaneously with the inner circular wall Wa in the method of manufacturing the organic EL display device 50a of the first embodiment.

As described above, according to the organic EL display device 50c and the method of manufacturing the organic EL display device 50c in accordance with the present embodiment, the frame-shaped inner circular wall Wa that protrudes in the thickness direction of the resin substrate layer 10 and extends along the boundary between the non-display area N and the display area D is formed in the insular non-display area N in the display area D in the inner circular wall forming step. Furthermore, in the sealing film forming step, after the organic buffer layer 27b is formed on the side faces of the inner circular wall Wa with the first inorganic film 26 intervening therebetween, the second inorganic film 28 is formed. In the sealing film forming step, the organic film 27 formed by vapor deposition in such a manner as to cover the first inorganic film 26 is ashed to form the organic buffer layer 27a on the side faces of the inner circular wall Wa with the first inorganic film 26 intervening therebetween in the non-display area N and to form the organic buffer layer 27b on the surface of the foreign object X adhering to the first inorganic film 26 primarily in the display area D. Therefore, the sealing structure provided by the sealing film 29 formed by a stack of the first inorganic film 26, the organic buffer layer 27b, and the second inorganic film 28 in the display area D is terminated by the inner circular wall Wa in the non-display area N. In this sealing structure terminated by the inner circular wall Wa in the non-display area N, the organic buffer layer 27a, provided on the side faces of the inner circular wall Wa, ensures that the second inorganic film 28 covers the first inorganic film 26. The sealing capability of the sealing film 29 can be thus guaranteed even if the insular non-display area N is provided in the display area D in the organic EL display device 50c.

Additionally according to the organic EL display device 50c and the method of manufacturing the organic EL display device 50c in accordance with the present embodiment, since the bottom face and each side face of the inner circular wall Wa and the outer circular walls Wc form an angle greater than or equal to 70° in lateral cross-sectional view, the first inorganic film 26 and the vapor deposition film such as the second electrodes 24 are tapered due to the lateral cross-sectional shape of the inner circular wall Wa and the outer circular walls Wc. Since the second inorganic film 28 is formed so as to cover the first inorganic film 26 and the organic buffer layers 27a and 27c in the second inorganic film forming step in the sealing film forming step, the sealing capability of the sealing film 29 can be guaranteed even if the top portions of the organic buffer layers 27a and 27c are in contact with the inner circular wall Wa and the outer circular walls Wc, respectively. Furthermore, since the vapor deposition film such as the second electrodes 24 is tapered due to the inner circular wall Wa and the outer circular walls Wc, it is possible to form a holed structure in the vapor deposition film by patterning without having to use a mask having an insular structure and to restrict water penetration to the organic EL element 25 through the vapor deposition film.

Additionally, according to the organic EL display device 50c and the method of manufacturing the organic EL display device 50c in accordance with the present embodiment, since the vapor deposition film such as the second electrodes 24 is tapered due to the outer circular walls Wc, the frame area F can be narrowed down.

Other Embodiments

The embodiments have so far discussed an example where the organic EL layer includes a stack of five layers: a hole injection layer, a hole transport layer, a light-emitting layer, an electron transport layer, and an electron injection layer. Alternatively, the organic EL layer may include, for example, a stack of three layers: a hole injection and transport layer, a light-emitting layer, and an electron transport and injection layer.

The embodiments have so far discussed an example where the organic EL display device includes the first electrodes serving as anodes and the second electrodes serving as cathodes. The present invention is applicable also to an organic EL display device in which the layer structure of the organic EL layer is reversed so that the first electrodes serve as cathodes and the second electrodes serve as anodes.

The embodiments have so far discussed an example where the organic EL display device includes an element substrate where the electrode of the TFT connected to the first electrode serves as the drain electrode. The present invention is applicable also to an organic EL display device including an element substrate where the electrode of the TFT connected to the first electrode serves as the source electrode.

The embodiments have so far discussed the organic EL display device as an exemplary display device. The present invention is applicable to any display device including a plurality of current-driven light-emitting elements, for instance, to a display device including QLEDs (quantum-dot light emitting diodes) which are light-emitting elements including a quantum dot containing layer.

INDUSTRIAL APPLICABILITY

As described above, the present invention is useful in flexible display devices.

REFERENCE SIGNS LIST

C Slit
D Display Area
F Frame Area
N Non-display Area
Wa Inner Circular Wall
Wb Outer Circular Wall
Wc Outer Circular Wall
10 Resin Substrate Layer (Base Substrate)
18h Source Conductive Layer (Wiring)
19 Planarization Film
20 TFT Layer
24 Second Electrode (Common Vapor Deposition Film, Common Electrode)
25 Organic EL element (Light-emitting Element)
26 First Inorganic Film
27 Organic Film
27a, 27c Organic Buffer Layer
28 Second Inorganic Film
29 Sealing Film
50a to 50c organic EL display device

The invention claimed is:

1. A display device comprising:
a base substrate;
light-emitting elements on the base substrate with a TFT layer intervening between the light-emitting elements and the base substrate, to form a display area;
a sealing film including a sequentially formed stack of a first inorganic film and a second inorganic film and provided so as to cover the light-emitting elements; and
an insular non-display area in the display area, wherein
the non-display area includes a frame-shaped inner circular wall protruding in a thickness direction of the base substrate and extending along a boundary between the non-display area and the display area,
the inner circular wall includes on a surface thereof an organic buffer layer interposed between the first inorganic film and the second inorganic film, and
there is provided a vapor deposition film between the inner circular wall and the first inorganic film.

2. The display device according to claim 1, wherein
the surface of the inner circular wall includes a first side face facing the display area and a second side face opposite the display area, and
the organic buffer layer is provided on the first side face and the second side face.

3. The display device according to claim 2, wherein the inner circular wall has a bottom face forming an angle of 70° to 150° with each of the first side face and the second side face in lateral cross-sectional view.

4. The display device according to claim 3, wherein the organic buffer layer is partially in contact with the inner circular wall.

5. The display device according to claim 1, wherein
the display area is rectangular and has at least one R-shaped corner,
the display area is surrounded by a frame area, and
the frame area includes an arc-shaped outer circular wall protruding in the thickness direction of the base substrate and extending along a boundary between the frame area and the display area, the outer circular wall being provided between the display area and a peripheral edge of the sealing film in plan view in a manner corresponding to the at least one R-shaped corner.

6. The display device according to claim 5, wherein
there is provided a common vapor deposition film across the display area, and
the common vapor deposition film includes a common electrode and extends beyond the outer circular wall to outside the sealing film in a corner where the outer circular wall is provided.

7. The display device according to claim 6, wherein
the TFT layer includes wiring and a planarization film on the wiring,
the common electrode is electrically connected to the wiring via a slit formed in the planarization film along at least one side of the display area, and
the slit is formed so as not to overlap the outer circular wall.

8. A display device comprising:
a base substrate;
light-emitting elements on the base substrate with a TFT layer intervening between the light-emitting elements and the base substrate, to form a display area;
a sealing film including a sequentially formed stack of a first inorganic film and a second inorganic film and provided so as to cover the light-emitting elements; and
an insular non-display area in the display area, wherein
the non-display area includes a frame-shaped inner circular wall protruding in a thickness direction of the base substrate and extending along a boundary between the non-display area and the display area,
the inner circular wall includes on a surface thereof an organic buffer layer interposed between the first inorganic film and the second inorganic film,
the display area is surrounded by a frame area,
the frame area includes a frame-shaped outer circular wall protruding in the thickness direction of the base substrate and extending along a boundary between the frame area and the display area, and
the outer circular wall includes on side faces thereof an organic buffer layer interposed between the first inorganic film and the second inorganic film.

9. The display device according to claim 8, wherein
there is provided a common vapor deposition film across the display area, the common vapor deposition film includes a common electrode, the TFT layer includes wiring and a planarization film on the wiring, the common electrode is electrically connected to the wiring via a slit formed in the planarization film, and an end portion of the common vapor deposition film other than the common electrode, the slit, the outer circular wall, and an end portion of the sealing film are arranged in this order in the frame area when viewed from the display area.

10. The display device according to claim 9, wherein the common electrode has an end portion thereof outside the sealing film in the frame area, and a part of the common electrode outside the sealing film is electrically insulated by the outer circular wall from another part of the common electrode in the display area.

11. The display device according to claim 8, wherein the non-display area has a through hole in the thickness direction of the base substrate inside the inner circular wall.

12. The display device according to claim 8, wherein the base substrate is flexible.

13. The display device according to claim 8, wherein the light-emitting elements are organic EL elements.

14. A method of manufacturing a display device including an insular non-display area in a display area, the method comprising:

forming a TFT layer on a base substrate;

forming light-emitting elements on the TFT layer to form the display area, and forming step of forming a sealing film so as to cover the light-emitting elements, wherein forming the sealing film is preceded by forming, in the non-display area, a frame-shaped inner circular wall protruding in a thickness direction of the base substrate and extending along a boundary between the non-display area and the display area, and forming the sealing film includes:
   forming a first inorganic film so as to cover the light-emitting elements;
   forming an organic film by vapor deposition so as to cover the first inorganic film;
   ashing the organic film to form an organic buffer layer on a surface of the inner circular wall; and
   forming a second inorganic film so as to cover the first inorganic film and the organic buffer layer.

15. The method according to claim 14, wherein the surface of the inner circular wall includes a first side face facing the display area and a second side face opposite the display area, and ashing the organic film forms the organic buffer layer on the first side face and the second side face.

16. The method according to claim 14, wherein forming the inner circular wall forms the inner circular wall with a bottom face and each side face forming an angle of 70° to 150° in lateral cross-sectional view.

17. The method according to claim 16 further comprising, between forming the inner circular wall and forming the sealing film, forming a vapor deposition film on a substrate having the inner circular wall formed thereon.

18. The method according to claim 14, wherein the base substrate is flexible.

19. The method according to claim 14, wherein the light-emitting elements are organic EL elements.

* * * * *